US008680920B2

(12) United States Patent
Hebert (10) Patent No.: US 8,680,920 B2
(45) Date of Patent: Mar. 25, 2014

(54) AREA EFFICIENT, PROGRAMMABLE-GAIN AMPLIFIER

(75) Inventor: Gary Hebert, Shrewsbury, MA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 12/857,099

(22) Filed: Aug. 16, 2010

(65) Prior Publication Data

US 2011/0068863 A1     Mar. 24, 2011

Related U.S. Application Data

(60) Provisional application No. 61/234,039, filed on Aug. 14, 2009, provisional application No. 61/234,031, filed on Aug. 14, 2009.

(51) Int. Cl.
    *H03F 1/36*          (2006.01)

(52) U.S. Cl.
    USPC ............................................ 330/86; 330/51

(58) Field of Classification Search
    USPC .......................................................... 330/86
    See application file for complete search history.

(56) References Cited

U.S. PATENT DOCUMENTS

| | | | | |
|---|---|---|---|---|
| 5,233,309 | A | * | 8/1993 | Spitalny et al. .................. 330/84 |
| 5,481,217 | A | * | 1/1996 | Nguyen ........................ 327/333 |
| 6,819,768 | B1 | | 11/2004 | Sculley |
| 2006/0017508 | A1 | | 1/2006 | Lenz |

OTHER PUBLICATIONS

Gabara et al., "Digitally Adjustable Resistors in CMOS for High-Performance Applications," IEEE Journal of Solid-State Circuits, 27:1176-1185 (1992).
International Search Report and the Written Opinion dated Oct. 27, 2010 from Corresponding PCT Application No. PCT/US2010/045595.

\* cited by examiner

*Primary Examiner* — Robert Pascal
*Assistant Examiner* — Khiem Nguyen
(74) *Attorney, Agent, or Firm* — McDermott Will & Emery LLP (57) ABSTRACT

A reconfigurable network arrangement of resistors and switches is constructed so that it can be coupled to one or more operational amplifiers and selectively programmed so as to set the gain of the resulting amplifier. The configuration of the network arrangement of resistors and switches to include resistors that can be connected in the feedback path in series and in parallel with each other is such as to provide a wider selection of gain settings, without the need to increase the physical area of the switches on a integrated circuit arrangement.

54 Claims, 4 Drawing Sheets

AREA EFFICIENT, PROGRAMMABLE-GAIN AMPLIFIER

RELATED APPLICATIONS

The present application is related to and claims priority from U.S. Provisional Patent Application Ser. No. 61/234,031 filed Aug. 14, 2009 in name of Gary K. Hebert and entitled Dynamic Switch Driver for Low-Distortion Programmable-Gain Amplifier, and U.S. Provisional Application Ser. No. 61/234,039 filed Aug. 14, 2009 in the name of Gary K. Hebert and entitled Area Efficient Programmable-Gain Amplifier (both applications being assigned to the present assignee and hereinafter the "Provisional Applications"), both applications being incorporated herein by reference in their entirety. The present application is also related to and incorporates by reference co-pending application U.S. Ser. No. 12/857074, filed contemporaneously with the present application in the name of Gary K. Hebert and entitled Dynamic Switch Driver for Low-Distortion Programmable-Gain Amplifier, also assigned to the present assignee and hereinafter being referred to as the "Co-pending Application"), the latter application claiming priority from the Provisional Applications and being incorporated herein by reference in its entirety.

FIELD

The following disclosure relates generally to an area-efficient gain programming network for amplifiers and to a programmable-gain amplifier that can be provided by combining the network with an amplifier, and more specifically to a low-noise, low distortion programmable-gain amplifier with gain settings that can be varied in arbitrarily-chosen discrete steps, and that can be implemented using a relatively small number of electronic switch elements in an integrated circuit.

BACKGROUND

Figure 1:
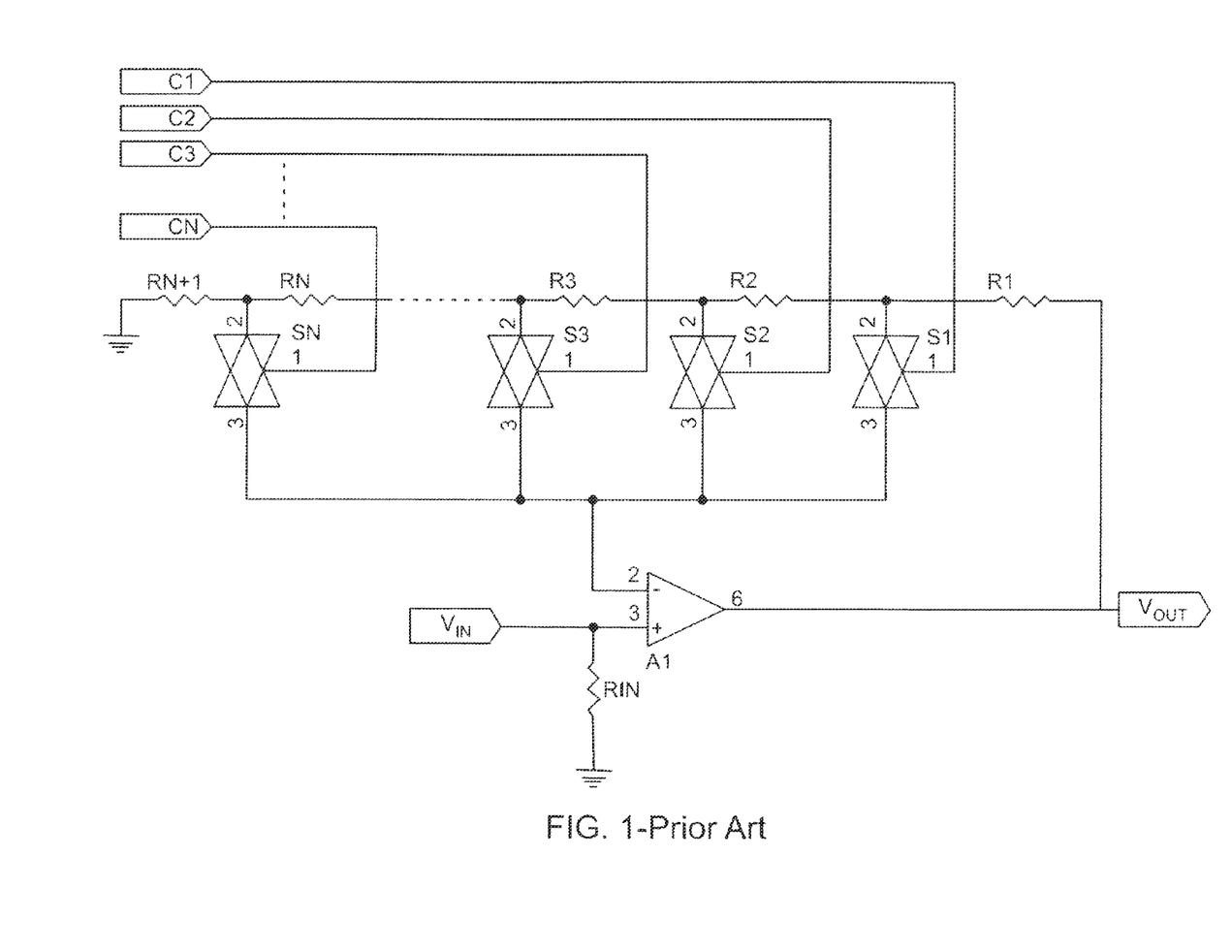
FIG. 1 is a partial schematic, partial block diagram of a prior art programmable gain amplifier using a reconfigurable network arrangement.

One prior art implementation of a low-distortion, programmable-gain amplifier is shown in FIG. 1. An input signal, which may be AC or DC, is applied to Vin. The output signal appears at $V_{OUT}$. In this illustrated arrangement the high-gain operational amplifier $A_1$ is configured as a non-inverting amplifier. This configuration is preferred for low-noise applications over the inverting configuration since the feedback network can be made low impedance to minimize its thermal noise contribution without compromising the amplifier input impedance, which may be set independently via resistor $R_{IN}$. The feedback network around operational amplifier $A_1$ is tapped at multiple points by electronic switch elements $S_1$ through $S_N$. Each switching element is typically constructed to include complementary metal-oxide semiconductor (CMOS) devices and can be independently turned on or off depending on the desired gain. Control signals ($C_1$ through $C_N$) provided at a control input are used to select the desired gain by turning on the appropriate switch $S_1$ through $S_N$ corresponding to the desired gain. Such an approach has the benefit that the variations in on-resistance of electronic switches $S_1$ through $S_N$ due to changes in input voltage do not affect the linearity of the output signal since no signal current flows through these switches. This minimizes distortion, so long as one and only one of electronic switches $S_1$ through $S_N$ is turned on at any one moment of time.

However, the on-resistance of each of these switches does contribute thermal noise to the total input noise of the amplifier. One way to decrease the on-resistance of CMOS electronic switches (and thus to reduce the amplifier's input noise) is to increase the physical area of the CMOS devices which make up the switches. In an integrated circuit, however, an increase in the area of a switch results in an increased die area. Since the approach illustrated in FIG. 1 requires one switch for each desired gain setting, and since each switch requires at least some die area, the necessary area can be a significant issue.

SUMMARY

In accordance with one aspect of the invention, a reconfigurable network arrangement is provided for use with at least one operational amplifier. The reconfigurable network arrangement comprises a plurality of resistors and a plurality switches constructed so that the resistors can be coupled to one or more operational amplifiers and selectively programmed so as to form a feedback path so as to selectively set the gain of the amplifier, the plurality of resistors and plurality of switches being arranged so that the resistors can be selectively connected in the feedback path in series and in parallel with each other so as to provide a selection of gain settings, while using fewer switches than would be required for the same number of gain settings in an all-series arrangement.

In accordance with another aspect, a reconfigurable network for use with at least one operational amplifier is provided. The reconfigurable network comprises: a feedback path arrangement configured to be connected to the operational amplifier so as to provide a reconfigurable feedback path between an input and an output of the operational amplifier so that the gain of the operational amplifier can be programmed at any one of a plurality of gain settings. The feedback path arrangement comprises: a first plurality of resistors connected in series so as to provide a resistor string; a first plurality of switches constructed and arranged so as to selectively connect one or more junctions between resistors of the first plurality to one of the operational amplifier's input terminals; a second plurality of resistors; and a second plurality of switches constructed and arranged so as to selectively connect each of the second plurality of resistors into the feedback path in parallel with one another; wherein the reconfigurable feedback path is configured to be coupled to the operational amplifier as a function of the one or more resistors of the first and second plurality connected in the feedback path wherein the reconfigurable feedback path connected to the operational amplifier is a function of the one or more resistors of the first and second plurality connected in the feedback path.

In accordance with yet another aspect, an amplifier circuit comprises: at least one operational amplifier; and a reconfigurable network arrangement for use with the operational amplifier, the reconfigurable network arrangement including: a plurality of resistors and a plurality switches constructed so that the resistors can be coupled to one or more operational amplifiers and selectively programmed so as to form a feedback path so as to selectively set the gain of the amplifier, the plurality of resistors and plurality of switches being arranged so that the resistors can be selectively connected in the feedback path in series and in parallel with each other so as to provide a selection of gain settings.

BRIEF DESCRIPTION OF THE DRAWINGS

Reference is made to the attached drawings, wherein elements having the same reference character designations represent like elements throughout, and wherein.

DETAILED DESCRIPTION OF THE DRAWINGS

Figure 2:
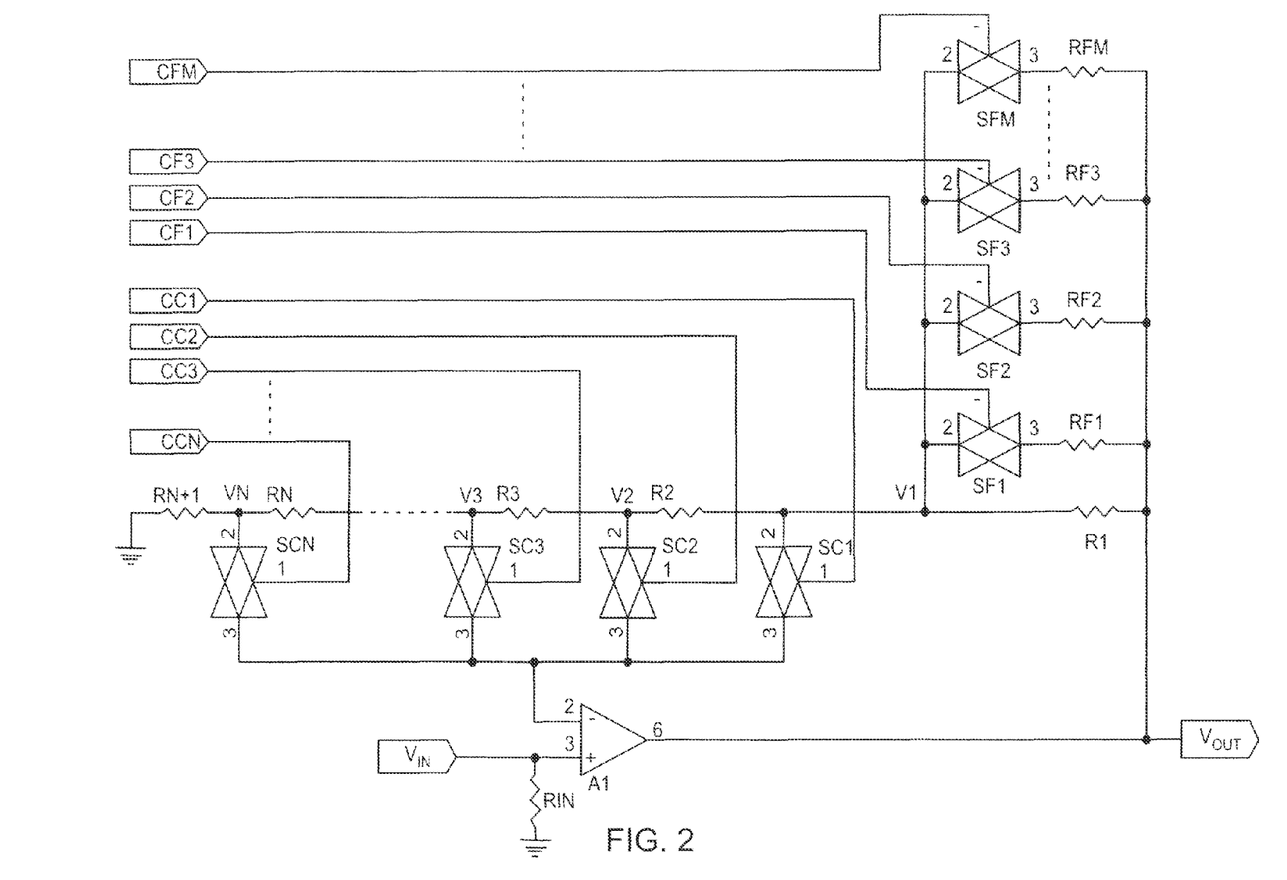
FIG. 2 is a partial schematic, partial block diagram of one embodiment of a programmable gain amplifier with one configuration of the employing the teachings described herein.

FIG. 2 is a schematic representation of one embodiment of the reconfigurable network arrangement connected to provide a programmable gain for an operational amplifier $A_1$. High-gain operational amplifier $A_1$ is configured as a non-inverting amplifier and arranged for single ended operation. Input voltage $V_{IN}$ is applied to the non-inverting input of non-inverting amplifier $A_1$. The network arrangement includes a plurality of separately operable switches, all arranged so that when selectively turned on, the switches define the voltage division ratio in the feedback path of the operational amplifier $A_1$ between its output and inverting input. The switches are individually and selectively operable so that the gain can be set as a function of which of the resistors RF1~RFM are included in the feedback path and by which point on the string of R1~RN+1 is selected, which in turn is determined by which of the switches are closed. Resistor $R_{IN}$ substantially sets the amplifier input impedance. A first set of resistors $R_1$ through $R_{N+1}$ are each connected in series with each other, between the output of the operational amplifier and system ground (or a reference node). Each node between adjacent resistors is connected through a corresponding switch $S_{C1}$ through $S_{CN}$ to the inverting input. The resistors $R_1$ through $R_{N+1}$ therefore comprise a tapped resistor string that provides feedback via a series of resistances defined by $R_1$ to $R_{N+1}$. Thus, closing switch $S_{C1}$ to the on state results in a voltage division ratio in the feedback path equal to (R2+R3+ ... Rn+Rn+1)/(R1+R2+R3+ ... Rn+Rn+1). Closing switch $S_{C2}$ to the on-state results in a voltage division ratio in the feedback path equal to (R3+ ... Rn+Rn+1)/(R1+R2+R3+ ... Rn+Rn+1) and so forth. Thus, discrete voltage dividers can be selected by selectively closing one of the electronic switches $S_1$ through $S_N$ while leaving the others switches in that series open. Control signals $C_{C1}$ through $C_{CN}$ respectively control the opening and closing of the corresponding switches $S_1$ through $S_N$ so that the control signal are used to select a series of individual closed-loop gain settings by turning on individual electronic switches $S_1$ through $S_N$, and connecting a single point along the tapped resistor string to non-inverting amplifier $A_1$'s inverting input. Of course, without departing from the spirit of the invention, the control signals $C_{C1}$ through $C_{CN}$ may be arranged, as more fully described in Co-pending Application, to allow slow transitions from one state to another, during which transitions more than one tap on the voltage divider may be connected simultaneously to the non-inverting amplifier $A_1$'s inverting input. The control signals can also be provided by a controller suitably configured to provide the appropriate control settings as a function of the application.

The network arrangement of resistors is also configured so that additional resistors $R_{F1}$ through $R_{FM}$ may each be connected in parallel with resistor $R_1$ in the feedback arrangement regardless of which of the switches $S_{C1}$ through $S_{CN}$ is closed. Resistors $R_{F1}$-$R_{FM}$ are connected in series with the corresponding switches $S_{F1}$ through $S_{FM}$ and parallel to the resistor $R_1$. By closing one or more of the switches $S_{F1}$ through $S_{FM}$, one or more of the resistors $R_{F1}$ through $R_{FM}$ are connected in parallel to the resistor $R_1$, thereby modifying the closed-loop gain when they are connected in parallel with resistor $R_1$. Control signals $C_{F1}$ through $C_{FM}$ determine the state of switches $S_{F1}$ through $S_{FM}$ respectively, selectively turning them on so as to connect none, some, or all of those resistors $R_{F1}$ through $R_{FM}$ (for which the corresponding switches $S_F$ have been turned on) in parallel with resistor $R_1$.

The control signals can be generated automatically, as for example in response to a control circuit, or manually, as for example a user defined input.

To examine the operation of the programmable-gain amplifier in more detail, it is helpful to define the sum of the resistances of resistors $R_2$ through $R_{N+1}$ as $R_{STRING}$. It is further useful to define a variable k denoting the fraction of the total resistance $R_{STRING}$ that is connected between the inverting input of $A_1$ and ground (or a reference node) when a single one of electronic switches $S_1$ through $S_N$ is turned on. Thus, there will be $(1-k)*R_{STRING}$ connected between $R_1$ and the inverting input of $A_1$, and $k*R_{STRING}$ connected between the inverting input of $A_1$ and the reference node or ground. Finally, it useful to define a resistance $R_P$ equal to the parallel combination of $R_1$ and any resistors ($R_{F1}$ through $R_{FM}$) connected in parallel with it those electronic switches $S_{F1}$ through $S_{FM}$ that are turned on. For example, if switches $S_{F1}$ and $S_{F2}$ are turned on, then $R_P = R_1 \| R_{F1} \| R_{F2}$.

Figure 3:
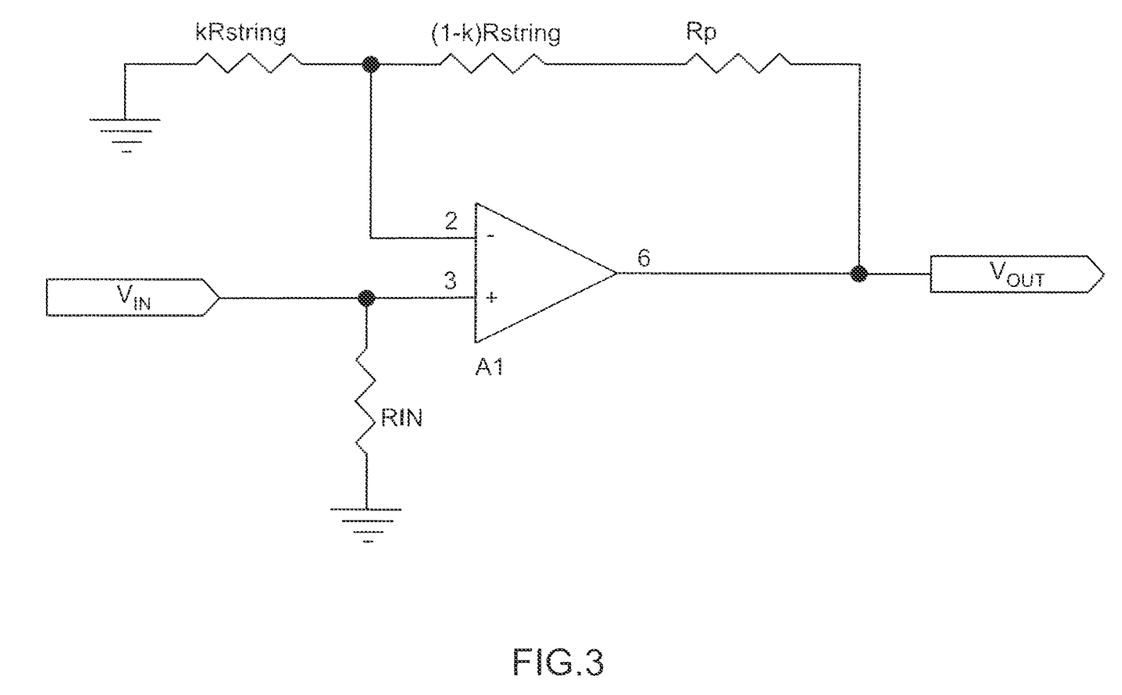
FIG. 3 is a partial schematic, partial block diagram of an example of a simplified version of the programmable gain amplifier shown in FIG. 2 for illustrative purposes.

FIG. 3 illustrates an example of the circuit configuration of FIG. 2 at a single gain setting using the definitions above. Utilizing these definitions, for any one of electronic switches $S_{C1}$ through $S_{CN}$ being on, and any combination of switches $S_{F1}$ through $S_{FM}$ being on, and assuming that the open-loop gain of $A_1$ is much greater than the desired closed-loop gain, the closed loop gain, $A_{CL}$, of operational amplifier $A_1$ can be expressed to be:

$$A_{CL} = \frac{V_{OUT}}{V_{IN}} \quad (1)$$
$$= 1 + \frac{R_P + (1-k)R_{STRING}}{kR_{STRING}}$$
$$= \frac{kR_{STRING} + (1-k)R_{STRING} + R_P}{kR_{STRING}}$$

and $$A_{CL} = \frac{R_{STRING} + R_P}{kR_{STRING}} = \left(\frac{1}{k}\right)\left(\frac{R_{STRING} + R_P}{R_{STRING}}\right). \quad (2)$$

It should be noted that there are two independent factors controlling the closed-loop gain of operational amplifier $A_1$. The first, 1/k, is a function of which of electronic switches $S_{C1}$ through $S_{CN}$ are turned on. The second term, $(R_{STRING} + R_P)/R_{STRING}$, is a function of which of electronic switches $S_{F1}$ through $S_{FM}$ are turned on. There are N possible values available for the variable k, corresponding to the N electronic switches $S_{C1}$ through $S_{CN}$ being turned on one at a time. There are $2^M$ possible values of $R_P$ corresponding to the various combinations of switches $S_{F1}$ through $S_{FM}$ being turned on. However, not all of these possible combinations are independent of one another. Since one of the advantages of the disclosed arrangement is to allow a set of arbitrarily-chosen gain settings to be implemented, the choices of values for $R_P$ is ideally limited to independent combinations, thus reducing the possible number of values of $R_P$ to M+1. Thus, the circuit in FIG. 2 allows N*(M+1) independent gain settings while requiring N+M switches. This is in contrast to the prior art circuit in FIG. 1, which allows only N gain settings with N switches.

It is clear that the arrangement in FIG. 2 requires fewer switches for a given number of gain settings than the circuit of FIG. 1. However, since signal current flows in electronic switches $S_{F1}$ through $S_{FM}$, (unlike switches $S_{C1}$ through $S_{CN}$) they are potential sources of distortion due to variation in on-resistance with signal voltage. This distortion can be mitigated with the appropriate choices of the combination of switches $S_{F1}$ through $S_{FM}$ used to implement the gain settings. In particular, the values of $R_{F1}$ through $R_{FM}$ are chosen such that the desired gain settings are achieved by successively turning on an additional switch for the next lower gain setting out of the M+1 range of settings. In this case, for a given setting of the gain switches $S_{C1}$ through $S_{CN}$, the highest gain setting is with all of the switches $S_{F1}$ through $S_{FM}$ off, and the resulting value of $R_P$ is equal to $R_1$. The next lowest gain setting is with one of the switches, $S_{F1}$, on, and the resulting value of $R_P$ is equal to $R_1 \| R_{F1}$. The next lowest setting is with two of the switches, $S_{F1}$ and $S_{F2}$, on, and the resulting value of $R_P$ is equal to $R_1 \| R_{F1} \| R_{F2}$. This pattern is continued such that the lowest gain setting possible for a given setting of switches $S_{C1}$ through $S_{CN}$ is with all of the switches $S_{F1}$ through $S_{FM}$ turned on. Such an approach results in a sharing of signal currents between the multiple switches that are turned on, minimizing the distortion contribution of any one. In an example of one embodiment, $R_P$ is designed to vary over a range of approximately 2.5 to 1, and none of the resistors $R_{F1}$ through $R_{FM}$ are less than ten times the value of resistor R1. This ensures that none of the switches $S_{F1}$ through $S_{FM}$ conducts more than one tenth of the signal current conducted by $R_1$. The distortion contribution of switches $S_{F1}$ through $S_{FM}$ can also be minimized by appropriate modulation of the control signals $C_{F1}$ through $C_{FM}$, as described in a Co-pending Application.

In one implementation, resistors $R_{F1}$ through $R_{FM}$ are chosen to implement a 1 dB decrease (a factor of 0.8913) in closed loop gain as each one is turned on. Resistors $R_1$ through $R_{N+1}$ are chosen so that each tap along the string of these resistors implements an 8 dB change in gain, such that the variable k changes by a factor 2.512 at each tap along the resistor string $R_{STRING}$ formed by resistors $R_1$ through $R_{N+1}$. In such an exemplary implementation, 7 resistors ($R_{F1}$ through $R_{F7}$) are required to implement eight 1 dB steps, and the value of $R_P$ will vary over an 8 dB range from $R_1$ to $R_1/2.512$.

Operational amplifier $A_1$ may be of a voltage-feedback type or a current-feedback type. For programmable-gain amplifiers in which the gain varies over a wide range, the current-feedback type is advantageous because the closed-loop bandwidth can be made to be substantially independent of the closed-loop gain, in contrast to the voltage-feedback type, where the closed-loop bandwidth is typically inversely proportional to the closed-loop gain. However, as is well-known in the art, the closed loop bandwidth of a current-feedback operational amplifier is inversely proportional to the value of the resistance between the amplifier output and its inverting input. Further, a given amplifier will typically require a minimum value of resistance between these terminals in order to maintain stability. Accordingly, when using a current-feedback operational amplifier, the minimum value of the resistance between the amplifier output and inverting input, equal to $R_1$ in parallel with all of the resistors $R_{F1}$ through $R_{FM}$, is an important aspect of the design. If one defines this resistance as $R_{PMIN}$, one may express the minimum gain of the programmable-gain amplifier, when k=1 (with switch $S_{F1}$ on) and $R_P = R_{PMIN}$, as:

$$A_{CLMIN} = \frac{R_{STRING} + R_{PMIN}}{R_{STRING}} \quad (3)$$

Therefore, choosing the minimum desired gain and the value of $R_{PMIN}$ will determine the resistance of $R_{STRING}$ (the sum of resistors $R_2$ through $R_{N+1}$), since:

$$R_{STRING} = \frac{R_{PMIN}}{A_{CLMIN} - 1} \quad (4)$$

Since, for any desired closed-loop gain setting, the value of $R_P$ is:

$$R_P = R_{STRING}(kA_{CL} - 1) \quad (5)$$

one may then find the remaining M values of $R_P$. From these M+1 values of $R_P$, it is straightforward to calculate the M resistor values $R_{F1}$ through $R_{FM}$. The highest value for $R_P$ will equal $R_1$. The next highest value, defined here as $R_{P1}$, will be made up of $R_1$ in parallel with $R_{F1}$, so $R_{F1}$ must be:

$$R_{F1} = \frac{R_{P1} * R_1}{R_1 - R_{P1}} \quad (6)$$

The values for resistors $R_{F2}$ through $R_{FM}$ may be calculated in a similar fashion.

With the values of resistors R1 and $R_{F1}$ through $R_{FM}$ defined, the values for k may be calculated. For the highest gain setting for each value of k (with $S_{F1}$ through $S_{FM}$ off), k may be calculated as:

$$k = \frac{R_{STRING} + R_1}{A_{CL} * R_{STRING}} \quad (7)$$

From the individual values of k for each coarse gain setting, the values of $R_2$ through $R_{N+1}$ may be calculated. For example, defining the value of k when switch $S_{C2}$ is on as $k_2$, we can calculate the value of resistor $R_2$ as:

$$R_2 = (1 - k_2) R_{STRING} \quad (8)$$

Similarly, defining the value of k when switch $S_{C3}$ is on as $k_3$, the value of resistor $R_3$ will be:

$$R_3 = R_2 - (1 - k_3) R_{STRING} \quad (9)$$

The remaining values for resistors $R_4$ through $R_N$ may be calculated in a similar fashion, while the value of resistor $R_{N+1}$ will be the difference between $R_{STRING}$ and the sum of resistors $R_1$ through $R_N$.

While the FIGS. 2 and 3 embodiment is shown as a reconfigurable network arrangement connected to a high-gain operational amplifier configured as a non-inverting amplifier, the teachings disclosed herein can be applied to a high-gain operational amplifier configured as an inverting amplifier. Furthermore, it is possible to deviate from the reconfigurable network arrangement of FIGS. 2 and 3 by moving the resistor network represented by Rp to a position between the reference node and the resistor $kR_{STRINGm}$. Further, while the amplifier is described as a single ended configuration, the operation amplifier can be as arranged in a differential mode.

Figure 4:
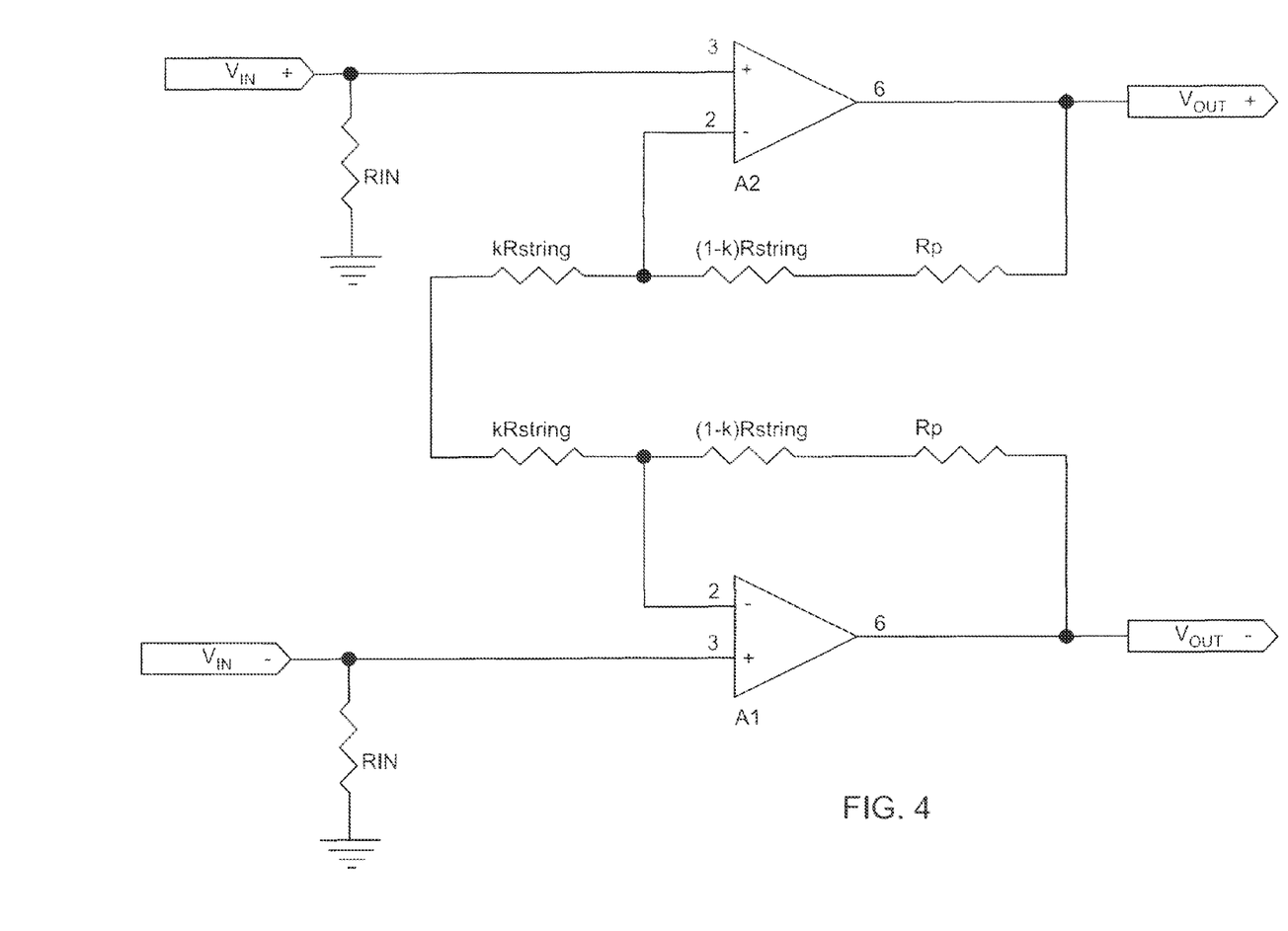
FIG. 4 is a partial schematic, partial block diagram of an example of an instrumentation amplifier employing the teachings described herein.

For example, as a further embodiment, one can extend the gain setting approach described to an amplifier topology known in the art as an instrumentation amplifier. Illustrated in FIG. 4, is a simplified schematic employing this approach to the input circuitry of an instrumentation amplifier formed by the two operational amplifiers A1 and A2. In this case, the input voltage is applied between terminals $V_{IN+}$ and $V_{IN-}$. The output voltage is available between terminals $V_{OUT+}$ and $V_{OUT-}$. The closed-loop gain for differential input voltages will be identical to the closed loop gain described previously for the single-ended programmable-gain amplifier. The closed-loop gain for common-mode input voltages will be unity as long as opamps $A_1$ and $A_2$ have sufficient open loop common-mode rejection.

Thus, the reconfigurable network arrangement forms an area-efficient gain programming network for amplifiers. When employed with an amplifier, the combination forms a programmable-gain amplifier whose gain can be controlled by controlling the operation of the various switches, and more specifically to a low-noise, low-distortion programmable-gain amplifier with gain settings that can be varied in arbitrarily-chosen discrete steps, and that can be implemented using a relatively small number of electronic switch elements in an integrated circuit.

It should be appreciated that a reconfigurable network arrangement of the type described can be formed with one or more operational amplifiers on a single integrated chip, or arranged separately from the operational amplifier as two or more separate parts. Further, while all of the embodiments of the reconfigurable feedback arrangement have been described as including one or more plurality of resistors, in implementing the circuits impedance devices can be used to establish the resistance values.

Those skilled in the art will recognize that changes can be made to the general approach described. For example, the gains chosen may be different than those cited for the embodiment mentioned above. The amplifier used may be implemented using different active devices and various topologies. The switches used may also vary in their implementation. In addition, while the illustrated embodiments are shown in FIGS. 2-4 as inverting amplifiers providing negative feedback, it is possible to employ the reconfigurable feedback with a non-inverting amplifier for positive feedback should an application for such an arrangement be required.

Thus, a new and improved area efficient, programmable-gain amplifier is provided in accordance with the present disclosure. The exemplary embodiments described in this specification have been presented by way of illustration rather than limitation, and various modifications, combinations and substitutions may be effected by those skilled in the art without departure either in spirit or scope from this disclosure in its broader aspects and as set forth in the appended claims.

The new and improved reconfigurable network arrangement when coupled to an operational amplifier provides an area efficient, programmable-gain amplifier. All elements thereof, are contained within the scope of at least one of the following claims. No elements of the presently disclosed system and method are meant to be disclaimed, nor are they intended to necessarily restrict the interpretation of the claims. In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A reconfigurable network arrangement for use with an operational amplifier, including:
    an operational amplifier;
    a plurality of resistors and a plurality switches constructed so that the resistors can be coupled to the operational amplifier and selectively programmed so as to form a feedback path so as to selectively set the gain of the amplifier, the plurality of resistors and plurality of switches being arranged so that the resistors can be selectively connected in the feedback path in series and in parallel with each other so as to provide a selection of gain settings;
    a first plurality of resistors connected in series so as to provide a resistor string;
    a first plurality of switches constructed and arranged so that one or more junctions between resistors of the first plurality can be connected to the operational amplifier's input terminals;
    a second plurality of resistors;
    a second plurality of switches constructed and arranged so each of the second plurality of resistors can be selectively connected into the feedback path in parallel with one another; and
    a controller for controlling the operation of each of the switches;
    wherein the reconfigurable feedback path is configured to be coupled to the operational amplifier as a function of the one or more resistors of the first and second plurality connected in the feedback path; and
    wherein the resistor string is constructed and arranged so that it can be connected between the output of the amplifier and a reference node, and is configured as a voltage divider, wherein the state of the first plurality of switches determines where the voltage divider is tapped with respect to the feedback path arrangement; and
    wherein one of the resistors (R1) of the resistor string can be connected between the output of the operational amplifier and the other resistors in the resistor string, such that the gain of the amplifier is defined as:

$$A_{CL} = \frac{R_{STRING} + R_P}{kR_{STRING}} = \left(\frac{1}{k}\right)\left(\frac{R_{STRING} + R_P}{R_{STRING}}\right),$$

wherein $R_{STRING}$ is the resistance of the sum of resistors of the first plurality of resistors that can be connected between the input and a reference node (R2 to RN+1);
    k is the fraction of the total resistor Rstring that is connected between the input of the operational amplifier and the reference node for a particular gain setting;
    $R_p$ is the resulting resistance provided by none, one, or more of the resistors of the second plurality connected into the feedback path in parallel with the one resistor (R1).

2. The reconfigurable network according to claim 1, wherein the second plurality of switches are constructed and arranged so as to selectively connect each of the second plurality of resistors into the feedback path so that resistors of the second plurality connected in the feedback path will be connected in parallel with at least one of the resistors of the first plurality.

3. The reconfigurable network according to claim 1, wherein the first plurality of resistors are arranged as a resistor string including a plurality of tapping points, and each of the first plurality of switches selectively taps a corresponding substantially one of the tapping points of the resistor string so as to define the voltage division ratio in the feedback path.

4. The reconfigurable network according to clam 1, wherein the second plurality of resistors are configured as a bank of resistors arranged so that each is connectable between the output of the amplifier and substantially one tap on the resistor string depending on the state of a corresponding switch of the second plurality.

5. The reconfigurable network according to claim 1, wherein a closed loop gain of the network is a function of the product of 1/k and ($R_{STRING}$ +$R_p$).

6. The reconfigurable network according to claim 1, wherein the first plurality of resistors includes N+1 resistors, the second plurality of resistors includes M resistors, k has a value between 0 and 1, and $R_p$ has possible values of $2^M$, wherein M is an integer.

7. The reconfigurable network according to claim 1, wherein each of the second plurality of resistors is successively connected in parallel with the resistor R1 of the first plurality such that the value of Rp for any gain setting is always determined as a function of the maximum number of parallel resistors connected in parallel with resistor R1.

8. The reconfigurable network according to claim 1, wherein each of the second plurality of resistors has a resistance at least ten times greater than the resistance of resistor R1 of the first plurality.

9. The reconfigurable network according to claim 1, wherein the feedback path arrangement is configured to be connected to the operational amplifier so as to provide a reconfigurable feedback path between the output and the inverting input of the operational amplifier.

10. The reconfigurable network according to claim 1, wherein the feedback path arrangement is further configured to be connected to a second operational amplifier so as to provide a second reconfigurable feedback path between an input and an output of the second operational amplifier so that the closed-loop differential gains of both operational amplifiers can be programmed at any one of a plurality of gain settings, the feedback path arrangement further comprising :
a third plurality of resistors connected in series so as to provide a second resistor string;
a third plurality of switches constructed and arranged so that one or more junctions can be selectively connected between resistors of the third plurality to one of the second operational amplifier's input terminals;
a fourth plurality of resistors; and
a fourth plurality of switches constructed and arranged so that each of the fourth plurality of resistors can be selectively connected into the second feedback path ;
wherein the selected gain setting is a function of the first and second feedback paths established as a function of the one or more resistors of the third and fourth plurality connected in the second feedback path.

11. The reconfigurable network according to claim 10, wherein the fourth plurality of switches are constructed and arranged so as to selectively connect each of the fourth plurality of resistors into the feedback path so that resistors of the fourth plurality connected in the feedback path will be connected in parallel with at least one of the resistors of the third plurality.

12. The reconfigurable network according to claim 10, wherein the resistor string is constructed and arranged so that it can be connected to the output of the amplifier, and is configured as a voltage divider, wherein the state of the third plurality of switches determines where the voltage divider is tapped with respect to the feedback path arrangement.

13. The reconfigurable network according to claim 10, wherein the third plurality of resistors is arranged as a resistor string including a plurality of tapping points, and each of the third plurality of switches selectively taps a corresponding substantially one of the tapping points of the resistor string so as to define the voltage division ratio in the feedback path.

14. The reconfigurable network according to clam 10, wherein the fourth plurality of resistors are configured as a bank of resistors arranged so that each is connectable between the output of the amplifier and one tap on the resistor string depending on the state of a corresponding switch of the fourth plurality.

15. The reconfigurable network according to claim 1, in which one of the resistors (R1) of the resistor string is configured to be connected between the output of the second operational amplifier and the other resistors in the resistor string, so that the gain of the amplifier is defined as:

$$A_{CL} = \frac{R_{STRING} + R_P}{kR_{STRING}} = \left(\frac{1}{k}\right)\left(\frac{R_{STRING} + R_P}{R_{STRING}}\right)$$

wherein $R_{STRING}$ is the resistance of the sum of resistors of the first plurality of resistors that can be connected between the input and a reference node (R2 to RN+1);
k is the fraction of the total resistor Rstring that is connected between the input of the second operational amplifier and the reference node for a particular gain setting;
$R_p$ is the resulting resistance provided by none, one, or more of the resistors of the fourth plurality connected into the feedback path in parallel with the one resistor (R1).

16. The reconfigurable network according to claim 15, wherein a closed loop gain of the network is a function of the product of 1/k and ($R_{STRING}$ +$R_p$) .

17. The reconfigurable network according to claim 15, wherein the first plurality of resistors includes N+1 resistors, the second plurality of resistors includes M resistors, k has a value between 0 and 1, and $R_p$ has possible values of $2^M$, wherein M is an integer.

18. The reconfigurable network according to claim 1, wherein the first plurality of switches includes N switches; and the second plurality of switches includes M switches, wherein the amplifier is programmable to any one of N*(M+1) states.

19. The reconfigurable network according to claim 1, wherein the values of the resistors of the second plurality of resistors are set so that each provides substantially a 1dB change in closed loop gain when connected in the feedback path.

20. The reconfigurable network according to claim 1, wherein the values of the resistors of the first plurality of resistors are set so that each provides substantially an 8dB change in gain of the amplifier.

21. The reconfigurable network according to claim 1, wherein the feedback path arrangement is configured to be connected to a second operational amplifier so as to provide a reconfigurable feedback path between the output and the non-inverting input of the second operational amplifier.

22. The reconfigurable network according to claim 1, wherein the feedback path arrangement is configured to be connected to a second operational amplifier so as to provide a reconfigurable feedback path between the output and the inverting input of the second operational amplifier.

23. The reconfigurable network according to claim 22, wherein the gain setting determined by the reconfigurable feedback network determines the differential gain of the resulting amplifier when the first and second operational amplifiers are connected as a differential pair.

24. The reconfigurable network according to claim 22, wherein the feedback path arrangement is configured to be connected to the first and second operational amplifiers so as to provide the respective first and second reconfigurable feedback paths between the inverting inputs and corresponding outputs of the respective operational amplifiers.

25. The reconfigurable network according to claim 1, wherein the feedback path arrangement is configured to be connected to a voltage-feedback type amplifier.

26. The reconfigurable network according to claim 1, wherein the feedback path arrangement is configured to be connected to a current-feedback type amplifier.

27. The reconfigurable network according to claim 1, wherein the operational amplifier is a non-inverting amplifier employing series-shunt feedback.

28. A reconfigurable network for setting a gain of an operational amplifier, comprising:
an operational amplifier;
a feedback path arrangement connected to the operational amplifier so as to provide a reconfigurable feedback path between an input and an output of the operational amplifier so that the gain of the operational amplifier can be programmed at any one of a plurality of gain settings, the feedback path arrangement comprising:
a first plurality of resistors connected in series so as to provide a resistor string;
a first plurality of switches constructed and arranged so as to selectively connect one or more junctions between resistors of the first plurality to one of the operational amplifier's input terminals;
a second plurality of resistors;
a second plurality of switches constructed and arranged so as to selectively connect each of the second plurality of resistors into the feedback path in parallel with one another; and
a controller for controlling the operation of each of the switches;
wherein the reconfigurable feedback path is configured to be coupled to the operational amplifier as a function of the one or more resistors of the first and second plurality connected in the feedback path;
wherein the resistor string is constructed and arranged so that it can be connected between the output of the amplifier and a reference node, and is configured as a voltage divider, wherein the state of the first plurality of switches determines where the voltage divider is tapped with respect to the feedback path arrangement; and
wherein one of the resistors (R1) of the resistor string can be connected between the output of the operational amplifier and the other resistors in the resistor string, such that the gain of the amplifier is defined as:

$$A_{CL} = \frac{R_{STRING} + R_P}{kR_{STRING}} = \left(\frac{1}{k}\right)\left(\frac{R_{STRING} + R_P}{R_{STRING}}\right),$$

wherein $R_{STRING}$ is the resistance of the sum of resistors of the first plurality of resistors that can be connected between the input and a reference node (R2 to RN+1);
k is the fraction of the total resistor Rstring that is connected between the input of the operational amplifier and the reference node for a particular gain setting;
$R_P$ is the resulting resistance provided by none, one, or more of the resistors of the second plurality connected into the feedback path in parallel with the one resistor (R1).

29. The reconfigurable network according to claim 28, wherein the second plurality of switches are constructed and arranged so as to selectively connect each of the second plurality of resistors into the feedback path so that resistors of the second plurality connected in the feedback path will be connected in parallel with at least one of the resistors of the first plurality.

30. The reconfigurable network according to claim 28, wherein the first plurality of resistors are arranged as a resistor string including a plurality of tapping points, and each of the first plurality of switches selectively taps a corresponding substantially one of the tapping points of the resistor string so as to define the voltage division ratio in the feedback path.

31. The reconfigurable network according to clam 28, wherein the second plurality of resistors are configured as a bank of resistors arranged so that each is connectable between the output of the amplifier and substantially one tap on the resistor string depending on the state of a corresponding switch of the second plurality.

32. The reconfigurable network according to claim 28, wherein the closed loop gain is a function of the product of 1/k and ($R_{STRING} + R_p$).

33. The reconfigurable network according to claim 28, wherein the first plurality of resistors includes N+1 resistors, the second plurality of resistors includes M resistors, k has a value between 0 and 1, and $R_p$ has possible values of $2^M$, wherein M is an integer.

34. The reconfigurable network according to claim 28, wherein each of the second plurality of resistors is successively connected in parallel with the resistor R1 of the first plurality such that the value of Rp for any gain setting is always determined by the maximum possible number of parallel resistors.

35. The reconfigurable network according to claim 28, wherein each of the second plurality of resistors has a resistance at least ten times greater than a resistance of resistor R1 of the first plurality.

36. The reconfigurable network according to claim 28, wherein the feedback path arrangement is configured to be connected to the operational amplifier so as to provide a reconfigurable feedback path between the output and the inverting input of the operational amplifier.

37. The reconfigurable network according to claim 28, wherein the feedback path arrangement is further configured to be connected to a second operational amplifier so as to provide a second reconfigurable feedback path between an input and an output of the second operational amplifier so that the differential gain, of the first and second operational amplifiers to a signal voltage applied between the non-inverting inputs of the two operation amplifiers, can be programmed at any one of a plurality of gain settings, the feedback path arrangement further comprising:
a third plurality of resistors connected in series so as to provide a second resistor string;
a third plurality of switches constructed and arranged so that one or more junctions can be selectively connected between resistors of the third plurality to one of the second operational amplifier's input terminals;
a fourth plurality of resistors; and
a fourth plurality of switches constructed and arranged so that each of the fourth plurality of resistors can be selectively connected into the second feedback path;
wherein the selected gain setting is a function of the first and second feedback paths established as a function of the one or more resistors of the third and fourth plurality connected in the second feedback path.

38. The reconfigurable network according to claim 37, wherein the fourth plurality of switches are constructed and arranged so as to selectively connect each of the fourth plurality of resistors into the feedback path so that resistors of the fourth plurality connected in the feedback path will be connected in parallel with at least one of the resistors of the third plurality.

39. The reconfigurable network according to claim 37, wherein the resistor string is constructed and arranged so that it can be connected between the output of the amplifier and a reference node, and is configured as a voltage divider, wherein the state of the third plurality of switches determines where the voltage divider is tapped with respect to the feedback path arrangement.

40. The reconfigurable network according to claim 37, wherein the third plurality of resistors are arranged as a resistor string including a plurality of tapping points, and each of the third plurality of switches selectively taps a corresponding substantially one of the tapping points of the resistor string so as to define the voltage division ratio in the feedback path.

41. The reconfigurable network according to clam 37, wherein the fourth plurality of resistors are configured as a bank of resistors arranged so that each is connectable between the output of the amplifier and one tap on the resistor string depending on the state of a corresponding switch of the fourth plurality.

42. The reconfigurable network according to claim 37, wherein the feedback path arrangement is configured to be connected to the second operational amplifier so as to provide a reconfigurable feedback path between the output and the inverting input of the second operational amplifier.

43. The reconfigurable network according to claim 42, wherein the gain setting determined by the reconfigurable feedback network determines the differential gain of the resulting amplifier and the common mode gain is always unity when the first and second operational amplifiers are connected as a differential pair.

44. The reconfigurable network according to claim 42, wherein the feedback path arrangement is configured to be connected to the first and second operational amplifiers so as to provide the respective first and second reconfigurable feedback paths between the inverting inputs and corresponding outputs of the respective operational amplifiers.

45. The reconfigurable network according to claim 28, wherein one of the resistors (R1) of the resistor string is configured to be connected between the output of a second operational amplifier and the other resistors in the resistor string, so that the gain of the amplifier is defined as::

$$A_{CL} = \frac{R_{STRING} + R_P}{kR_{STRING}} = \left(\frac{1}{k}\right)\left(\frac{R_{STRING} + R_P}{R_{STRING}}\right)$$

wherein $R_{STRING}$ is the resistance of the sum of resistors of the first plurality of resistors that can be connected between the input and a reference node (R2 to RN+1);
k is the fraction of the total resistor Rstring that is connected between the input of the second operational amplifier and the reference node for a particular gain setting;
$R_p$ is the resulting resistance provided by none, one, or more of the resistors of the fourth plurality connected into the feedback path in parallel with the one resistor (R1).

46. The reconfigurable network according to claim 45, wherein a closed loop gain of the network is a function of the product of 1/k and ($R_{STRING} + R_p$).

47. The reconfigurable network according to claim 45, wherein the first plurality of resistors includes N+1 resistors, the second plurality of resistors includes M resistors, k has a value between 0 and 1, and $R_p$ has possible values of $2^M$, wherein M is an integer.

48. The reconfigurable network according to claim 28, wherein the first plurality of switches includes N switches; and the second plurality of switches includes M switches, wherein the amplifier is programmable to any one of N*(M+1) states.

49. The reconfigurable network according to claim 28, wherein the values of the resistors of the second plurality of resistors are set so that each provides substantially a 1dB change in closed loop gain when connected in the feedback path.

50. The reconfigurable network according to claim 28, wherein the values of the resistors of the first plurality of resistors are set so that each provides substantially an 8dB change in the gain of the amplifier.

51. The reconfigurable network according to claim 28, wherein the feedback path arrangement is configured to be connected to a second operational amplifier so as to provide a reconfigurable feedback path between the output and the non-inverting input of the second operational amplifier.

52. The reconfigurable network according to claim 28, wherein the feedback path arrangement configured to be connected to a voltage-feedback type amplifier.

53. The reconfigurable network according to claim 28, wherein the feedback path arrangement configured to be connected to a current-feedback type amplifier.

54. The reconfigurable network according to claim 28, wherein the operational amplifier is a non-inverting amplifier employing series-shunt feedback.

* * * * *

UNITED STATES PATENT AND TRADEMARK OFFICE
CERTIFICATE OF CORRECTION

PATENT NO.       : 8,680,920 B2                           Page 1 of 1
APPLICATION NO.  : 12/857099
DATED            : March 25, 2014
INVENTOR(S)      : Gary Hebert

It is certified that error appears in the above-identified patent and that said Letters Patent is hereby corrected as shown below:

In the Claims

Column 11, line 24, "non-inverting" should be changed to --inverting--.

Column 14, line 53, "non-inverting" should be changed to --inverting--.

Signed and Sealed this
Fourteenth Day of October, 2014

Michelle K. Lee
*Deputy Director of the United States Patent and Trademark Office*